(12) United States Patent
Kim

(10) Patent No.: US 10,714,546 B2
(45) Date of Patent: Jul. 14, 2020

(54) ORGANIC LIGHT-EMITTING DISPLAY DEVICE HAVING BANK INSULATING LAYER

(71) Applicant: LG DISPLAY CO., LTD., Seoul (KR)

(72) Inventor: Min-Su Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/490,508

(22) Filed: Apr. 18, 2017

(65) Prior Publication Data

US 2017/0345879 A1 Nov. 30, 2017

(30) Foreign Application Priority Data

May 31, 2016 (KR) .................. 10-2016-0067738

(51) Int. Cl.
*H01L 27/32* (2006.01)
*H01L 51/50* (2006.01)
*H01L 51/52* (2006.01)

(52) U.S. Cl.
CPC ...... *H01L 27/3246* (2013.01); *H01L 51/5012* (2013.01); *H01L 51/5253* (2013.01)

(58) Field of Classification Search
CPC .............................. H01L 51/52; H01L 51/56
USPC ........................ 257/88, 98; 438/29
See application file for complete search history.

(56) References Cited

U.S. PATENT DOCUMENTS

| | | | | |
|---|---|---|---|---|
| 6,359,606 B1 * | 3/2002 | Yudasaka | ............ | H01L 27/3246 313/483 |
| 6,690,110 B1 * | 2/2004 | Yamada | ................. | H05B 33/14 313/506 |
| 2004/0041753 A1 * | 3/2004 | Nakanishi | ............ | G09G 3/3233 345/76 |
| 2004/0135145 A1 * | 7/2004 | Nakanishi | .............. | G09G 3/325 257/59 |
| 2006/0255720 A1 * | 11/2006 | Hirai | ................... | H01L 51/0005 313/503 |
| 2009/0309489 A1 * | 12/2009 | Takata | ................ | H01L 27/3246 313/504 |
| 2010/0102335 A1 * | 4/2010 | Takagi | ................ | H01L 27/3276 257/88 |
| 2011/0101401 A1 * | 5/2011 | Aratani | ................... | H01L 51/50 257/98 |
| 2011/0198597 A1 * | 8/2011 | Antonenkov | ....... | H01L 51/5228 257/59 |

(Continued)

FOREIGN PATENT DOCUMENTS

| | | |
|---|---|---|
| CN | 101714549 A | 5/2010 |
| CN | 101728421 A | 6/2010 |

(Continued)

*Primary Examiner* — Sheng-Bai Zhu

(74) *Attorney, Agent, or Firm* — Birch, Stewart, Kolasch & Birch, LLP

(57) ABSTRACT

An organic light-emitting display device according to an embodiment includes a light-emitting structure. The light-emitting structure includes a lower electrode, an organic light-emitting layer, and an upper electrode, which are stacked one above another in sequence. The organic light-emitting display device further includes a bank insulating layer covering the edge of the lower electrode. The organic light-emitting layer extends onto the bank insulating layer. The organic light-emitting layer includes a side surface being vertically aligned with a side surface of the bank insulating layer.

7 Claims, 5 Drawing Sheets

(56) References Cited

U.S. PATENT DOCUMENTS

| | | | |
|---|---|---|---|
| 2012/0193657 A1* | 8/2012 | von Malm | H01L 27/153 |
| | | | 257/89 |
| 2015/0060822 A1* | 3/2015 | Kamiya | H01L 51/5225 |
| | | | 257/40 |
| 2015/0144909 A1* | 5/2015 | Byun | H01L 51/5253 |
| | | | 257/40 |
| 2015/0155347 A1* | 6/2015 | Baek | H01L 27/3272 |
| | | | 257/40 |
| 2016/0093680 A1* | 3/2016 | Paek | H01L 27/3246 |
| | | | 257/40 |

FOREIGN PATENT DOCUMENTS

| | | |
|---|---|---|
| TW | 200733786 A | 9/2007 |
| TW | 201244203 A1 | 11/2012 |
| TW | 201421674 A | 6/2014 |
| TW | 201613088 A | 4/2016 |

* cited by examiner

ORGANIC LIGHT-EMITTING DISPLAY DEVICE HAVING BANK INSULATING LAYER

This application claims the priority benefit of Korean Patent Application No. 10-2016-0067738, filed on May 31, 2016, which is hereby incorporated by reference as if fully set forth herein.

BACKGROUND OF THE INVENTION

Field of the Invention

The present invention relates to an organic light-emitting display device in which the edge of a lower electrode of a light-emitting structure is covered with a bank insulating layer.

Discussion of the Related Art

Generally, electronic appliances, such as a monitor, a TV, a laptop computer, and a digital camera, include a display device to realize an image. An exemplary display device may include a liquid crystal display device or an organic light-emitting display device.

The organic light-emitting display device may include a light-emitting structure located in a display area of a lower substrate. The light-emitting structure may include, for example, a lower electrode, an organic light-emitting layer, and an upper electrode, which are stacked one above another in sequence. The organic light-emitting display device may further include a bank insulating layer configured to cover the edge of the lower electrode. The organic light-emitting layer may extend onto the bank insulating layer. The bank insulating layer may include an organic material.

Because the organic light-emitting layer is very vulnerable to moisture, a method of manufacturing the organic light-emitting display device may include an encapsulation process in order to prevent the entry of moisture from the outside. For example, the method of manufacturing the organic light-emitting display device may include a process of forming a protective layer using an inorganic material on the lower substrate, on which the light-emitting structure and the bank insulating layer have been formed, and a process of attaching an upper substrate to the lower substrate, on which the protective layer has been formed, using an adhesive layer.

The organic light-emitting layer and the bank insulating layer may be formed through a deposition process using a mask. The deposition process using the mask may create deposition shadow due to the deformation of the lower substrate and/or the mask disposed on the lower substrate. The length of the deposition shadow may be proportional to the size of the lower substrate. That is, the larger the area of the organic light-emitting display device is, the greater the increase in the length that the organic light-emitting layer and the bank insulating layer extend onto a non-display area, which is located outside the display area of the lower substrate, due to the deposition shadow.

As a result, the organic light-emitting layer and the bank insulating layer, each including an organic material, may serve as a path for the entry of moisture into the organic light-emitting display device. Further as the lengths of the organic light-emitting layer and the bank insulating layer, which are formed in the non-display area of the lower substrate, increase due to the deposition shadow, the lifespan of the light-emitting structure may be deteriorated.

In addition, when the lengths of the organic light-emitting layer and the bank insulating layer, which are formed in the non-display area of the lower substrate, increase due to the deposition shadow, the non-display area of the lower substrate, which comes into contact with the adhesive layer, is reduced, which may deteriorate the rigidity of the organic light-emitting display device.

SUMMARY OF THE INVENTION

Accordingly, the present invention is directed to an organic light-emitting display device having a bank insulating layer that substantially obviates one or more problems due to limitations and disadvantages of the related art.

One object of the present invention is to provide an organic light-emitting display device, which may prevent deterioration in the lifespan of a light-emitting structure due to deposition shadow.

Another object of the present invention is to provide an organic light-emitting display device, which may prevent deterioration in the rigidity thereof due to deposition shadow.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic light-emitting display device including a lower electrode located on a lower substrate, a bank insulating layer configured to cover an edge of the lower electrode, an organic light-emitting layer located on the lower electrode and extending to the bank insulating layer, and an upper electrode located on the organic light-emitting layer, wherein the bank insulating layer includes a side surface configured to be vertically aligned with a side surface of the organic light-emitting layer.

The upper electrode may include a side surface configured to be vertically aligned with the side surface of the organic light-emitting layer.

The organic light-emitting display device may further include a capping layer located on an upper surface of the upper electrode, and a protective layer located on the capping layer and extending to the side surface of the bank insulating layer.

The capping layer may include a side surface configured to be vertically aligned with a side surface of the upper electrode.

In accordance with another aspect of the present invention, there is provided an organic light-emitting display device including a lower substrate including a display area and a non-display area located outside the display area, a light-emitting structure located in the display area of the lower substrate, the light-emitting structure including a lower electrode, an organic light-emitting layer, and an upper electrode, which are stacked one above another in sequence, and a bank insulating layer located between an edge of the lower electrode and the organic light-emitting layer, where the bank insulating layer extends in an outward direction of the lower electrode. The bank insulating layer includes a side surface that faces the non-display area of the lower substrate, and the side surface of the bank insulating layer is vertically aligned with a side surface of the organic light-emitting layer that faces the non-display area of the lower substrate.

The side surface of the bank insulating layer and the side surface of the organic light-emitting layer that face the non-display area of the lower substrate may be located in the display area of the lower substrate.

The upper electrode may extend onto the side surface of the bank insulating layer that faces the non-display area of the lower substrate.

The organic light-emitting display device may further include a protective layer located on the light-emitting structure and extending to the non-display area of the lower substrate, and a capping layer located between the upper electrode and the protective layer. The capping layer may include a side surface that faces the non-display area of the lower substrate, and the side surface of the capping layer may be located on an upper surface of the upper electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
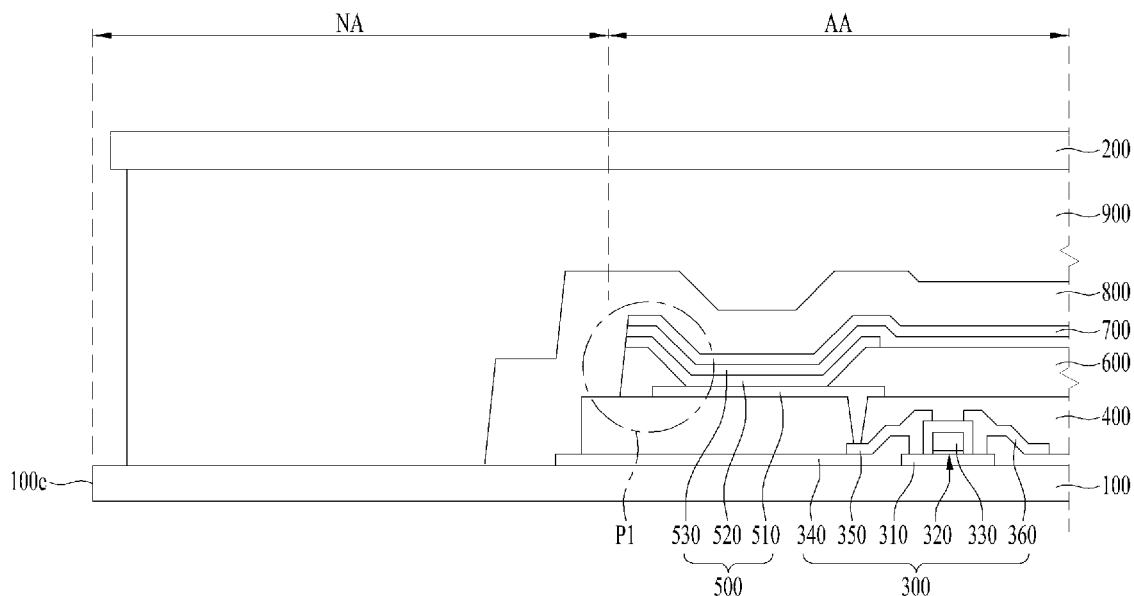
FIG. 1 is a cross-sectional view illustrating an organic light-emitting display device according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
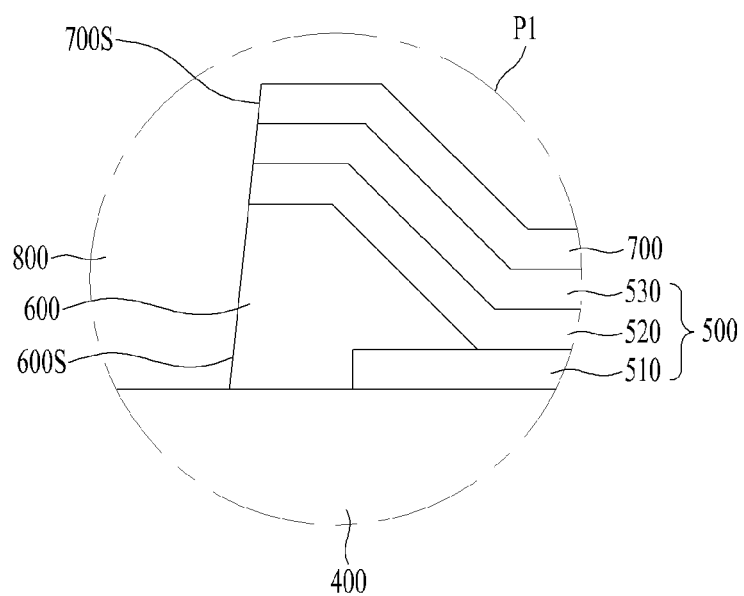
FIG. 2 is an enlarged view of region P1 in FIG. 1.

FIG. 1 is a cross-sectional view illustrating an organic light-emitting display device according to an embodiment of the present invention. FIG. 2 is an enlarged view of region P1 in FIG. 1. All the components of the organic light-emitting display device according to this and all other embodiments of the present invention are operatively coupled and configured. Further, one or more features from one or more embodiments may be applied to any other embodiments.

Referring to FIGS. 1 and 2, the organic light-emitting display device according to the embodiment of the present invention may include a lower substrate 100, an upper substrate 200, a thin-film transistor 300, a planarization layer 400, a light-emitting structure 500, a bank insulating layer 600, a protective layer 800, and an adhesive layer 900. Although one thin-film transistor 300 and light-emitting structure 500 may be shown, it is understood that the organic light-emitting display device includes a plurality of such thin-film transistors and light-emitting structures.

The lower substrate 100 may support the thin-film transistor 300 and the light-emitting structure 500. The lower substrate 100 may include a display area AA and a non-display area NA. The non-display area NA may be located outside the display area AA. For example, the non-display area NA may be located close to the side edge surface of the lower substrate 100.

The lower substrate 100 may include an insulating material and/or a transparent material. For example, the lower substrate 100 may include glass or plastic.

The upper substrate 200 may be disposed on the lower substrate 100. The upper substrate 200 may vertically overlap the display area AA and the non-display area NA of the lower substrate 100.

The upper substrate 200 may include a metal material. For example, the upper substrate 200 may include aluminum or copper.

The thin-film transistor 300 may be located between the lower substrate 100 and the upper substrate 200. For example, the thin-film transistor 300 may be disposed on the surface of the display area AA of the lower substrate 100 facing the upper substrate 200.

The organic light-emitting display device according to the embodiment of the present invention is described such that the thin-film transistor 300 is in directly contact with the lower substrate 100. However, an organic light-emitting display device according to another embodiment of the present invention may further include a buffer layer disposed between the lower substrate 100 and the thin-film transistor 300. The buffer layer may include an insulating material. For example, the buffer layer may include a silicon oxide and/or a silicon nitride.

The thin-film transistor 300 may comprise a semiconductor layer 310 including a source area, a drain area and a channel area, a gate electrode 330 vertically overlapping the channel area of the semiconductor layer 310, a gate insulating layer 320 disposed between the semiconductor layer 310 and the gate electrode 330, a drain electrode 350 connected to the drain area of the semiconductor layer 310, a source electrode 360 connected to the source area of the semiconductor layer 310, and an interlayer insulating layer 340 located between the gate electrode 330 and the drain electrode 350, and between the gate electrode 330 and the source electrode 360.

The semiconductor layer 310 may include a semiconductor material. For example, the semiconductor layer 310 may include amorphous silicon or polycrystalline silicon.

The gate electrode 330, the drain electrode 350, and the source electrode 360 may include a conductive material. For example, the gate electrode 330, the drain electrode 350, and the source electrode 360 may include a metal. The source electrode 360 may include the same material as the drain electrode 350. The gate electrode 330 may include a material different from that of the drain electrode 350 and the source electrode 360.

The gate insulating layer 320 and the interlayer insulating layer 340 may include an insulating material. A side surface of the gate insulating layer 320 may be vertically aligned with a side surface of the gate electrode 330. The interlayer insulating layer 340 may cover the entire display area AA of the lower substrate 100.

The organic light-emitting display device according to the embodiment of the present invention is described such that the thin-film transistor 300 includes the gate electrode 330 located on the upper surface of the semiconductor layer 310. However, the organic light-emitting display device according to another embodiment of the present invention may include the thin-film transistor 300 in which the semiconductor layer 310 is located on an upper surface of the gate electrode 330.

The planarization layer 400 may remove steps caused by the thin-film transistor 300. For example, an upper surface of the planarization layer 400 may be parallel to a surface of the lower substrate 100.

The planarization layer 400 may cover the entire display area AA of the lower substrate 100. For example, the planarization layer 400 may be in directly contact with an upper surface of the interlayer insulating layer 340. The drain electrode 350 and the source electrode 360 may be covered with the planarization layer 400.

The planarization layer 400 may include an insulating material. For example, the planarization layer 400 may include silicon oxide.

The light-emitting structure 500 may generate light for realizing a particular color. The light-emitting structure 500 may be disposed on the display area AA of the lower substrate 100. For example, the light-emitting structure 500 may be disposed between the planarization layer 400 and the upper substrate 200.

The light-emitting structure 500 may include a lower electrode 510, an organic light-emitting layer 520, and an upper electrode 530, which are sequentially stacked. The lower electrode 510 may be electrically connected to the thin-film transistor 300. For example, the planarization layer 400 may include a contact hole, which partially exposes the drain electrode 350 of the thin-film transistor 300. The lower electrode 510 may be in direct contact with the drain electrode 350 via this contact hole.

The lower electrode 510 and the upper electrode 530 may include a conductive material. The upper electrode 530 may include a material different from that of the lower electrode 510. One of the lower electrode 510 and the upper electrode 530 may include a transparent material. For example, the lower electrode 510 may include indium tin oxide (ITO) or indium zinc oxide (IZO). The upper electrode 530 may include a metal. The upper electrode 530 may have a material having high reflectivity. For example, the upper electrode 530 may include aluminum.

The lower electrode 510 may be disconnected from each other between adjacent pixel areas. The upper electrode 530 may be connected to each other between adjacent pixel areas. For example, the brightness of a color realized in each pixel area may be adjusted by the voltage and the current applied to the lower electrode 510.

The organic light-emitting display device according to the embodiment of the present invention is described as being of a bottom emission type in which the upper substrate 200 and the upper electrode 530 include a metal. However, an organic light-emitting display device according to another embodiment of the present invention may be of a top emission type. For example, in the organic light-emitting display device according to another embodiment of the present invention, the upper substrate 200 and the upper electrode 530 may include a transparent material.

The organic light-emitting layer 520 may generate light, the brightness of which corresponds to the voltage difference between the lower electrode 510 and the upper electrode 530. The light generated by the organic light-emitting layer 520 may realize a particular color. For example, the light generated by the organic light-emitting layer 520 in each pixel area may be realized as one of red, green, blue, and white. The organic light-emitting layer 520 may be separated from adjacent pixel areas. The organic light-emitting layer 520 located in the adjacent pixel areas may realize different colors.

The organic light-emitting layer 520 may include an emission material layer (EML) containing an organic emission material. The organic light-emitting layer 520 may be a multi-layer structure in order to increase luminous efficacy. For example, the organic light-emitting layer 520 may further include at least one of a hole injection layer (HIL), a hole transporting layer (HTL), an electron transporting layer (ETL), and an electron injection layer (EIL).

A side surface of the organic light-emitting layer 520 may be located in the display area AA of the lower substrate 100. For example, the organic light-emitting layer 520 may be formed by sequentially performing a deposition process of an organic material using a mask and an organic ashing process of removing the organic material deposited in the non-display area NA of the lower substrate 100.

In the organic light-emitting display device according to the embodiment of the present invention, the organic light-emitting layer 520 of the light-emitting structure 500 may be disposed only on the display area AA of the lower substrate 100. Thus, the organic light-emitting display device according to the embodiment of the present invention may prevent the organic light-emitting layer 520 from serving as a path for the entry of moisture due to deposition shadow.

A side surface of the organic light-emitting layer 520 facing the non-display area NA of the lower substrate 100 may be continuous with a side surface of the upper electrode 530 facing the non-display area NA of the lower substrate 100. The organic light-emitting layer 520 may include a side surface vertically aligned with the side surface of the upper electrode 530. For example, the organic ashing process for forming the organic light-emitting layer 520 may be performed using a mask, which is used for patterning the upper electrode 530.

The bank insulating layer 600 may realize insulation between the lower electrodes 510 located in adjacent pixel areas. For example, the bank insulating layer 600 may cover the edge of the lower electrode 510 located in each pixel area. The organic light-emitting layer 520 may extend onto the bank insulating layer 600. For example, the side surface of the organic light-emitting layer 520 that is disconnected between adjacent pixel areas may be disposed on the bank insulating layer 600.

The bank insulating layer 600 may include an insulating material. The bank insulating layer 600 may include an organic material. For example, the bank insulating layer 600 may include one of benzo cyclo-butene (BCB), poly-imide, and photo-acryl.

As shown in FIG. 2, a side surface 600S of the bank insulating layer 600 facing the non-display area NA of the lower substrate 100 may be disposed on the display area AA of the lower substrate 100. For example, the bank insulating layer 600 may be formed by sequentially performing a deposition process of an organic material using a mask and an organic ashing process of removing the organic material deposited in the non-display area NA of the lower substrate 100.

In the organic light-emitting display device according to the embodiment of the present invention, the bank insulating layer 600 may be located only in the display area AA of the lower substrate 100. Thus, the organic light-emitting display device according to the embodiment of the present invention may prevent the bank insulating layer 600 from serving as a path for the entry of moisture due to deposition shadow.

The side surface 600S of the bank insulating layer 600 that faces the non-display area NA of the lower substrate 100 may be vertically aligned with the side surface of the organic light-emitting layer 520 that faces the non-display area NA of the lower substrate 100. For example, the side surface 600S of the bank insulating layer 600 facing the non-display area NA of the lower substrate 100 may be continuous with the side surface of the organic light-emitting layer 520. The organic light-emitting layer 520 and the bank insulating layer 600, which are formed in the non-display area NA of the lower substrate 100 by deposition shadow, may be removed at the same time. For example, the organic light-emitting layer 520 and the bank insulating layer 600 may be formed at the same time by depositing an organic material for forming the bank insulating layer 600 and an organic material for forming the organic light-emitting layer 520 on the lower substrate 100, and removing the organic light-emitting layer 520 and the bank insulating layer 600, which are formed in the non-display area NA of the lower substrate 100, by an organic ashing process using a mask, which is used for patterning the upper electrode 530. Thus, the organic light-emitting display device according to the embodiment of the present invention may reduce the manufacturing cost as a result of removing the organic light-emitting layer 520 and the bank insulating layer 600, which are formed in the non-display area NA of the lower substrate 100, using a mask, which is used for patterning the upper electrode 530.

The protective layer 800 may prevent external moisture from entering the light-emitting structure 500. For example, the protective layer 800 may include an inorganic material having a high moisture-permeation prevention effect.

The protective layer 800 may be disposed on the light-emitting structure 500. The protective layer 800 may extend onto the non-display area NA of the lower substrate 100. The side surface of the light-emitting structure 500 may be covered with the protective layer 800. For example, the side surface 600S of the bank insulating layer 600 facing the non-display area NA of the lower substrate 100 may be in directly contact with the protective layer 800.

The adhesive layer 900 may be disposed on the protective layer 800. The adhesive layer 900 may extend onto the non-display area NA of the lower substrate 100. The adhesive layer 900 may be in directly contact with the non-display area NA of the lower substrate 100, which is located close to the side edge surface 100e of the lower substrate 100. The upper substrate 200 may be attached to the lower substrate 100, on which the light-emitting structure 500 has been formed, by the adhesive layer 900.

In the organic light-emitting display device according to the embodiment of the present invention, since removing the organic light-emitting layer 520 and the bank insulating layer 600 formed in the non-display area NA of the lower substrate 100 by deposition shadow, the organic light-emitting layer 520 and the bank insulating layer 600 may be only disposed on the display area AA of the lower substrate 100. Thus, the organic light-emitting display device according to the embodiment of the present invention may prevent the organic light-emitting layer 520 and the bank insulating layer 600 from serving as a path for the entry of moisture by deposition shadow. In addition, the organic light-emitting display device according to the embodiment of the present invention may prevent a reduction in the bonding area between the lower substrate 100 and the adhesive layer 900.

The organic light-emitting display device according to the embodiment of the present invention may further include a capping layer 700 disposed between an upper surface of the light-emitting structure 500 and the protective layer 800. The capping layer 700 may prevent damage to the upper electrode 530 of the light-emitting structure 500. For example, the upper surface of the upper electrode 530 may be covered with the capping layer 700.

The capping layer 700 may include an insulating material. For example, the capping layer 700 may include an organic material.

As shown in FIG. 2, a side surface 700S of the capping layer 700 facing the non-display area NA of the lower substrate 100 may be located in the display area AA of the lower substrate 100. For example, the capping layer 700 may be formed by sequentially performing a deposition process of an organic material using a mask and an organic ashing process of removing the organic material deposited in the non-display area NA of the lower substrate 100.

In the organic light-emitting display device according to the embodiment of the present invention, the capping layer 700 formed of an organic material may be located only in the display area AA of the lower substrate 100. Thus, the organic light-emitting display device according to the embodiment of the present invention may prevent the capping layer 700 from serving as a path for the entry of moisture due to deposition shadow.

Accordingly, in the organic light-emitting display device according to the embodiment of the present invention, since removing the organic material deposited in the non-display area NA of the lower substrate 100 by deposition shadow, the permeation of moisture due to deposition shadow may be prevented, and the lower substrate 100 may be satisfactorily contact with the adhesive layer 900.

The side surface 700S of the capping layer 700 that faces the non-display area NA of the lower substrate 100 may be vertically aligned with the side surface of the upper electrode 530 that faces the non-display area NA of the lower substrate 100. The side surface 700s of the capping layer 700 facing the non-display area NA of the lower substrate 100 may be continuous with the side surface of the upper electrode 530. For example, the organic ashing process for forming the capping layer 700 may be performed using a mask, which is used for patterning the upper electrode 530. Thus, the organic light-emitting display device according to the embodiment of the present invention may reduce the manufacturing cost as a result of removing the organic material, which is deposited in the non-display area NA of the lower substrate 100 by deposition shadow, using the same mask.

The organic light-emitting display device according to the embodiment of the present invention is described such that the side surface 700S of the capping layer 700 that faces the non-display area NA of the lower substrate 100 is vertically aligned with the side surface of the upper electrode 530 that faces the non-display area NA of the lower substrate 100. The vertical alignment also may be a slightly slanted vertical alignment as shown in FIG. 2.

Figure 3:
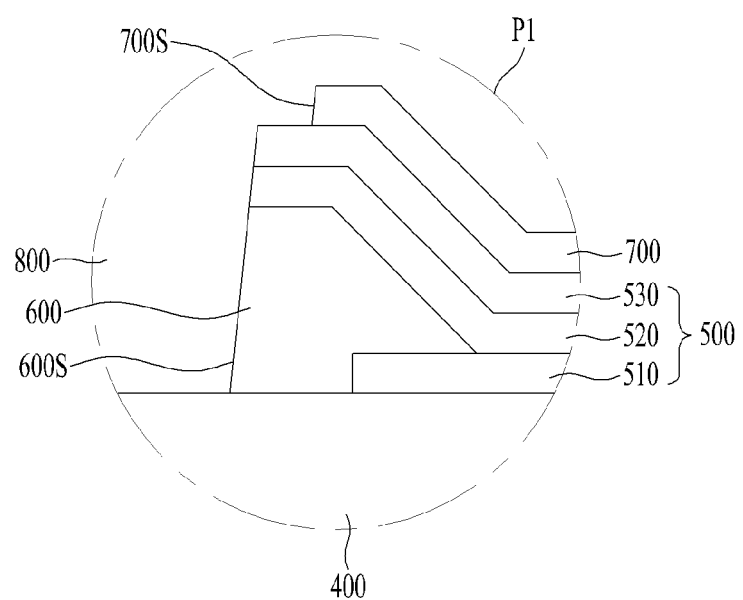
FIG. 3 is an enlarged view of a partial region of an organic light-emitting display device according to another embodiment of the present invention.

In another example, as illustrated in FIG. 3, in the organic light-emitting display device according to another embodiment of the present invention, the capping layer 700 may partially expose the upper surface of the upper electrode 530. Thus, the organic light-emitting display device according to another embodiment of the present invention may prevent the capping layer 700 from extending to the side surface of the light-emitting structure 500 that faces the non-display area NA of the lower substrate 100, so as to be contact with the organic light-emitting layer 520 and/or the bank insulating layer 600 due to processing error, thereby preventing the generation of a path for the entry of moisture into the organic light-emitting layer 520.

Figure 4:
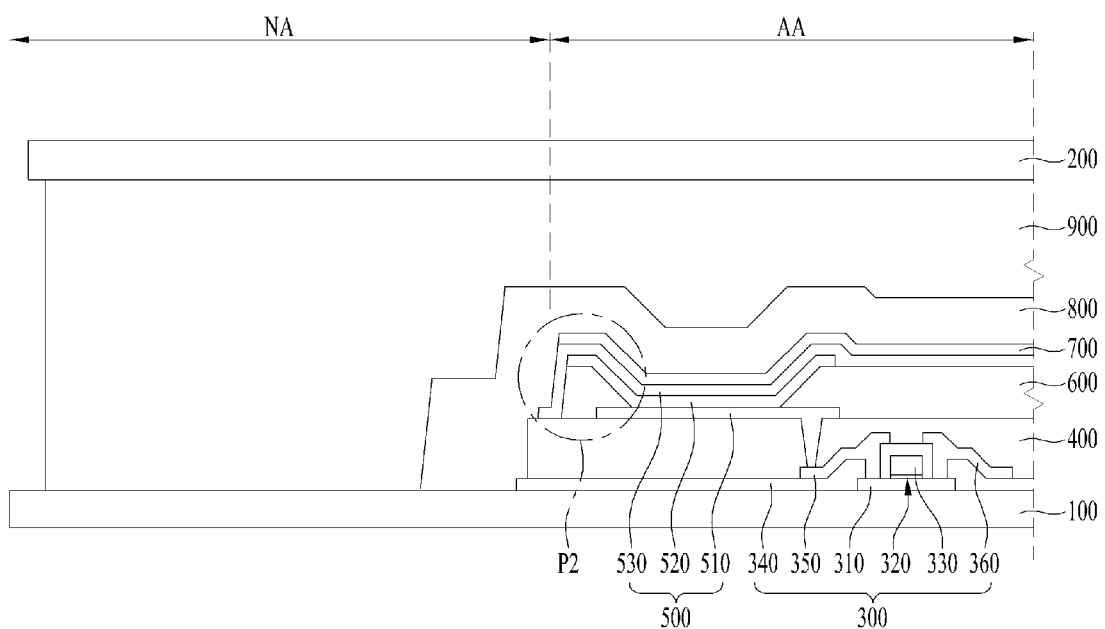
FIG. 4 is a cross-sectional view illustrating an organic light-emitting display device according to another embodiment of the present invention.
Figure 5:
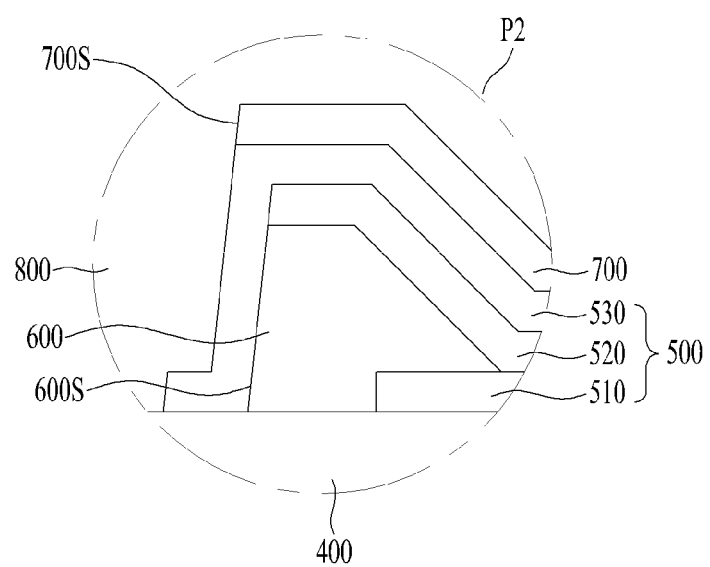
FIG. 5 is an enlarged view of region P2 in FIG. 4.

The organic light-emitting display device according to the embodiment of the present invention is described such that the side surface 600S of the bank insulating layer 600 facing the non-display area NA of the lower substrate 100 is vertically aligned with the side surface of the upper electrode 530 facing the non-display area NA of the lower substrate 100. However, as illustrated in FIGS. 4 and 5, in the organic light-emitting display device according to another embodiment of the present invention, the upper electrode 530 may extend onto the side surface of the organic light-emitting layer 520 and the side surface 600S of the bank insulating layer 600 that face the non-display area NA of the lower substrate 100. Thus, the organic light-emitting display device according to another embodiment of the present invention may prevent moisture, which penetrates defects of the protective layer 800, from moving into the light-emitting structure 520.

In addition, referring to FIGS. 4 and 5, the organic light-emitting display device according to another embodiment of the present invention is described such that the side surface 700S of the capping layer 700 that faces the non-display area NA of the lower substrate 100 is vertically aligned with the display surface of the upper electrode 530, which is disposed on the side surface 600S of the bank insulation layer 600. The vertical alignment also may be a slightly slanted vertical alignment as shown in FIG. 5.

Figure 6:
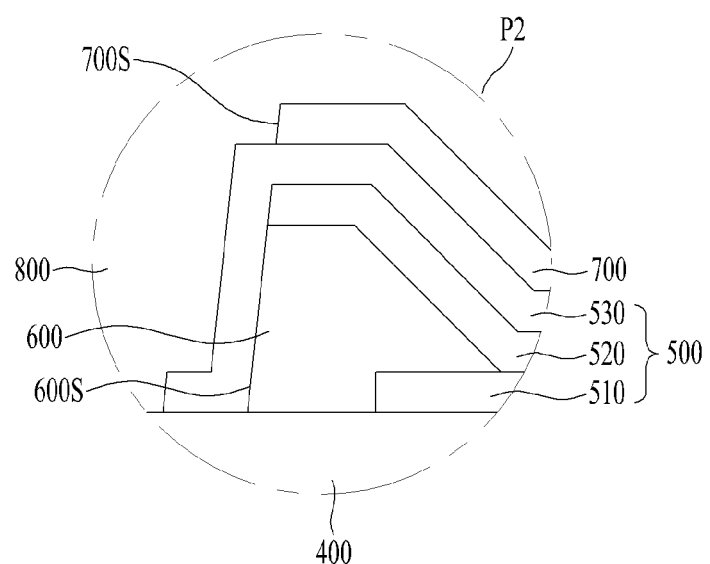
FIG. 6 is an enlarged view of a partial region of an organic light-emitting display device according to a further embodiment of the present invention.

In another example, as illustrated in FIG. 6, in the organic light-emitting display device according to a further embodiment of the present invention, the capping layer 700 may expose a portion of the upper surface of the upper electrode 530. For example, in the organic light-emitting display device according to the further embodiment of the present invention, the side surface 700S of the capping layer 700 facing the non-display area NA of the lower substrate 100 may be vertically aligned with the side surface 600S of the bank insulation layer 600 facing the non-display area NA of the lower substrate 100. That is, in the organic light-emitting display device according to the further embodiment of the present invention, the organic light-emitting layer 520, the bank insulating layer 600, and the capping layer 700, which are formed of an organic material, may be formed by an organic ashing process using the same mask. Thus, the organic light-emitting display device according to the further embodiment of the present invention may reduce the cost incurred for the removal of the organic material deposited in the non-display area NA of the lower substrate 100 by deposition shadow.

As is apparent from the above description, in an organic light-emitting display device according to one or more embodiments of the present invention, an organic light-emitting layer and a bank insulating layer, which include an organic material, may be located only in a display area of a lower substrate. As such, the organic light-emitting display device according to the embodiments of the present invention may realize a sufficient non-display area of the lower substrate that is in contact with an adhesive layer. Accordingly, the organic light-emitting display device according to the embodiments of the present invention may prevent deterioration in the rigidity thereof due to an insufficient contact area between the lower substrate and the adhesive layer.

In addition, in the organic light-emitting display device according to the embodiments of the present invention, the organic light-emitting layer and the bank insulating layer may not serve as a path for the entry of moisture. Accordingly, the organic light-emitting display device according to the present invention may achieve increased reliability in the lifespan thereof.

It will be apparent to those skilled in the art that the present invention described above is not limited to the embodiments described above and the accompanying drawings, and various substitutions, modifications, and alterations may be devised within the spirit and scope of the present invention.

What is claimed is:
1. An organic light-emitting display device comprising:
  a lower electrode disposed on a lower substrate, the lower substrate having a non-display area including a side edge surface of the lower substrate;
  a bank insulating layer covering an edge of the lower electrode, the bank insulating layer including a side surface facing and disposed closest to the non-display area including the side edge surface of the lower substrate;

an organic light-emitting layer disposed on the lower electrode, the organic light-emitting layer extending to the bank insulating layer, the organic light-emitting layer including a side surface being vertically aligned with the side surface of the bank insulating layer; and an upper electrode disposed on the organic light-emitting layer, the upper electrode including an end portion being disposed closer than the edge of the lower electrode to the side edge surface of the lower substrate, the end portion of the upper electrode having the same material as another portion of the upper electrode, the end portion having an upper surface; and a protective layer disposed on the upper surface of the end portion, wherein the vertically aligned side surfaces of the bank insulating layer and the organic light-emitting layer are in contact with the upper electrode; so that the end portion of the upper electrode is disposed on the same layer as the lower electrode, and wherein a lower surface of the end portion of the upper electrode towards the lower substrate is in contact with the same layer as a lower surface of the lower electrode towards the lower substrate.

2. The organic light-emitting display device according to claim 1, further comprising:

a capping layer disposed on an upper surface of the upper electrode; and the protective layer being further disposed on the capping layer, the protective layer extending to the side surface of the bank insulating layer.

3. The organic light-emitting display device according to claim 2, wherein the capping layer includes a side surface being vertically aligned with a surface of the upper electrode which is disposed on the side surface of the bank insulating layer.

4. The organic light-emitting display device according to claim 1, wherein the vertically aligned side surfaces of the bank insulating layer and the organic light-emitting layer form a slightly slanted vertical line.

5. The organic light-emitting display device according to claim 1, wherein the protective layer is further on the organic light-emitting layer and the bank insulating layer, and wherein the protective layer covers the side surface of the bank insulating layer and the side surface of the organic light-emitting layer, and contacts the lower substrate.

6. The organic light-emitting display device according to claim 5, further comprising an adhesive layer covering the protective layer, and contacting the lower substrate.

7. The organic light-emitting display device according to claim 1, further comprising a planarization layer between the lower substrate and the lower electrode, wherein the planarization layer extends between the lower substrate and the end portion of the upper electrode, and wherein the lower electrode, the end of the upper electrode, and the bank insulation layer contact the planarization layer.

* * * * *